US009453863B2

(12) United States Patent
Bartley et al.

(10) Patent No.: US 9,453,863 B2
(45) Date of Patent: Sep. 27, 2016

(54) IMPLEMENTING FREQUENCY SPECTRUM ANALYSIS USING CAUSALITY HILBERT TRANSFORM RESULTS OF VNA-GENERATED S-PARAMETER MODEL INFORMATION

(71) Applicant: International Business Machines Corporation, Armonk, NY (US)

(72) Inventors: Gerald K. Bartley, Rochester, MN (US); Matthew S. Doyle, Rochester, MN (US); Richard B. Ericson, Rochester, MN (US); Wesley D. Martin, Rochester, MN (US); George R. Zettles, IV, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 986 days.

(21) Appl. No.: 13/679,073

(22) Filed: Nov. 16, 2012

(65) Prior Publication Data

US 2014/0142883 A1    May 22, 2014

(51) Int. Cl.
| | |
|---|---|
| G01R 29/26 | (2006.01) |
| G01R 23/20 | (2006.01) |
| G06F 17/40 | (2006.01) |
| G06F 19/00 | (2011.01) |
| G01R 27/28 | (2006.01) |

(52) U.S. Cl.
CPC ............... *G01R 27/28* (2013.01); *G01R 23/20* (2013.01); *G01R 29/26* (2013.01); *G06F 17/40* (2013.01); *G06F 19/00* (2013.01)

(58) Field of Classification Search
CPC ............................... G01R 27/28; G01R 29/26

USPC .................................................. 702/111, 191
See application file for complete search history.

(56) References Cited

U.S. PATENT DOCUMENTS

| | | | | | |
|---|---|---|---|---|---|
| 3,032,712 | A | * | 5/1962 | Hurvitz | G01R 23/20 324/624 |
| 3,440,349 | A | * | 4/1969 | Gibbs | G01H 3/00 340/540 |
| 3,506,915 | A | * | 4/1970 | Pastori | G01R 29/26 324/601 |
| 5,307,284 | A | | 4/1994 | Brunfeldt et al. | |
| 6,529,844 | B1 | | 3/2003 | Kapetanic et al. | |
| 6,700,388 | B1 | * | 3/2004 | Mayor | G01R 29/0892 324/537 |

(Continued)

OTHER PUBLICATIONS

Hansen (Engineering Noise Control, [online], [retrieved on Oct. 22, 2015]. Retrieved from the http://www.who.int/occupational_health/publications/noise10.pdf, Published Jun. 6, 2006).*

(Continued)

*Primary Examiner* — Edward Cosimano
(74) *Attorney, Agent, or Firm* — Joan Pennington

(57) ABSTRACT

A method, system and computer program product are provided for implementing frequency spectrum analysis of noise in a device under test using causality (Hilbert Transform) results of Vector Network Analyzer (VNA) VNA-generated S-parameter model Information. A plurality of S-parameter samples are collected from the VNA generated S-parameter model Information. A Hilbert Transform of the collected plurality of S-parameter samples is used for error magnitude per frequency point analysis. An average error magnitude of predefined collected error magnitude samples is calculated to identify environmental noise in the device under test and used to identify acceptable environmental effects on the device under test.

16 Claims, 4 Drawing Sheets

(56) References Cited

U.S. PATENT DOCUMENTS

| | | | |
|---|---|---|---|
| 6,701,265 B2 | 3/2004 | Hill et al. | |
| 6,826,515 B2* | 11/2004 | Bernardi | G01H 3/14 379/387.01 |
| 6,928,373 B2 | 8/2005 | Martens et al. | |
| 7,064,555 B2* | 6/2006 | Jamneala | G01R 35/005 324/601 |
| 7,107,170 B2 | 9/2006 | Jamneala et al. | |
| 7,941,231 B1* | 5/2011 | Dunn | G06F 1/203 361/695 |
| 8,155,639 B2* | 4/2012 | Prather | G01R 31/002 324/457 |
| 8,160,574 B1* | 4/2012 | Nelson | H04W 52/24 340/517 |
| 8,218,611 B2* | 7/2012 | Desai | G01R 31/31917 375/224 |
| 2003/0125894 A1* | 7/2003 | Dunsmore | G01S 7/4004 702/109 |
| 2003/0191609 A1* | 10/2003 | Bernardi | G01H 3/14 702/191 |
| 2003/0202573 A1* | 10/2003 | Yamaguchi | G01R 31/31709 375/226 |
| 2004/0160228 A1* | 8/2004 | Jamneala | G01R 35/005 324/601 |
| 2004/0162689 A1* | 8/2004 | Jamneala | G01R 35/005 702/104 |
| 2008/0086533 A1* | 4/2008 | Neuhauser | G06F 19/327 709/206 |
| 2008/0091087 A1* | 4/2008 | Neuhauser | G06F 19/327 600/301 |
| 2008/0091451 A1* | 4/2008 | Crystal | G06F 19/327 705/300 |
| 2008/0091762 A1* | 4/2008 | Neuhauser | G06F 19/327 709/201 |
| 2008/0109295 A1* | 5/2008 | McConochie | G06F 19/327 705/7.29 |
| 2008/0238441 A1 | 10/2008 | Rhymes et al. | |
| 2008/0281893 A1* | 11/2008 | Rao | G06F 17/141 708/290 |
| 2009/0066343 A1* | 3/2009 | Prather | G01R 31/002 324/628 |
| 2009/0195498 A1* | 8/2009 | Karapattu | G01R 31/31917 345/156 |
| 2012/0076007 A1* | 3/2012 | Nelson | H04W 52/24 370/252 |
| 2013/0325420 A1* | 12/2013 | Lalgudi | G06F 17/17 703/2 |

OTHER PUBLICATIONS

M. Wojnowski et al., "Device Characterization Techniques Based on Causal Relationships," IEEE Transactions on Microwave Theory and Techniques, vol. 60, No. 7, Jul. 2012, pp. 2203-2219.

A. Bayram et al., "Frequency-Domain Measurement of Indoor UWB Propagation," IEEE Antennas and Propagation Society International Symposium, Jun. 20-25, 2004, pp. 1303-1306, vol. 2.

* cited by examiner

US 9,453,863 B2

IMPLEMENTING FREQUENCY SPECTRUM ANALYSIS USING CAUSALITY HILBERT TRANSFORM RESULTS OF VNA-GENERATED S-PARAMETER MODEL INFORMATION

FIELD OF THE INVENTION

The present invention relates generally to the data processing field, and more particularly, relates to a method, system and computer program product for implementing frequency spectrum analysis of environmental noise at a device or hardware under test using causality (Hilbert Transform) results of Vector Network Analyzer (VNA) VNA-generated scattering-parameter (S-parameter) model information.

DESCRIPTION OF THE RELATED ART

Engineers are generally unaware of the amount of extraneous noise present in model extractions, such as scattering-parameter (S-parameter) model extractions from hardware measured by Vector Network Analyzers (VNA) in a laboratory.

Radio Frequency (RF) noise is becoming a growing problem in today's lab environment. Many employees have a cellular phone, and currently smart cellular phones have as many as four different antennas in them to be able to interact with multiple RF devices. Companies are starting to use more wireless networking devices such as: laptops, tablet computers; to allow employees faster access to data.

Many institutions and public areas are installing additional infrastructure devices including repeaters, networks, access points, and the like to support increasingly used handsets, remote controllers, services, and applications. With numerous wireless devices transmitting energy, previously deemed quiet signal integrity labs are under stress to remain quiet. Also laboratory equipment does not need to meet the same emissions requirements that consumer products do. The continuous increase in both the number and variety of new RF enabled devices cause increasing environmental noise issues in the laboratory.

Frequency spectrum analyzers (EMI receivers) are generally available to characterize sources of noise, radio signals, radiation, and the like through an antenna, such as a horn antenna. However, frequency spectrum analyzers can only characterize a general environment and are not tied directly to an instantaneous measurement, nor can the antenna be placed exactly at the point of measurement.

A need exists for an effective mechanism for implementing frequency spectrum analysis of environmental noise at a device or hardware under test. It is desirable that such mechanism effectively identifies error-magnitude per frequency point information that can be used to determine the amount of environmental noise that the measured device receives so that appropriate steps to remove noise sources or seek shielded laboratory space are enabled.

SUMMARY OF THE INVENTION

Principal aspects of the present invention are to provide a method, system and computer program product for implementing frequency spectrum analysis of environmental noise in a device or hardware under test using causality (Hilbert Transform) results of Vector Network Analyzer (VNA) VNA-generated S-parameter model Information. Other important aspects of the present invention are to provide such method, system and computer program product substantially without negative effects and that overcome many of the disadvantages of prior art arrangements.

In brief, a method, system and computer program product are provided for implementing frequency spectrum analysis of environmental noise at a device under test using causality (Hilbert Transform) results of Vector Network Analyzer (VNA) VNA-generated S-parameter model Information. A plurality of S-parameter samples are collected from the VNA generated S-parameter model information. A Hilbert Transform of the collected plurality of S-parameter samples is used for error magnitude per frequency point analysis. An average error magnitude of predefined collected error magnitude samples is calculated to identify environmental noise in the device under test and is used to identify acceptable environmental effects on the device under test.

In accordance with features of the invention, causality checking with the Hilbert Transform of the plurality of S-parameter samples is used for displaying a graphical representation of environmental noise at the device under test.

In accordance with features of the invention, animating error magnitude samples optionally is provided to graphically observe noise effects.

In accordance with features of the invention, the identified environmental noise at the device under test (DUT) is sampled at the same instant of the VNA-generated S-parameter model Information for the DUT.

In accordance with features of the invention, the plurality of S-parameter samples capture instantaneous noise events that occur in a given laboratory environment and advantageously are subsequently combined to form a picture of the amount of noise present, functioning like a frequency spectrum analyzer.

In accordance with features of the invention, a user can determine the amount of environmental noise that the device under test receives and take steps to remove noise sources or seek a different shielded laboratory space.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing frequency spectrum analysis of noise in a device or hardware under test using causality (Hilbert Transform) results of Vector Network Analyzer (VNA) VNA-generated S-parameter model information.

Figure 1:
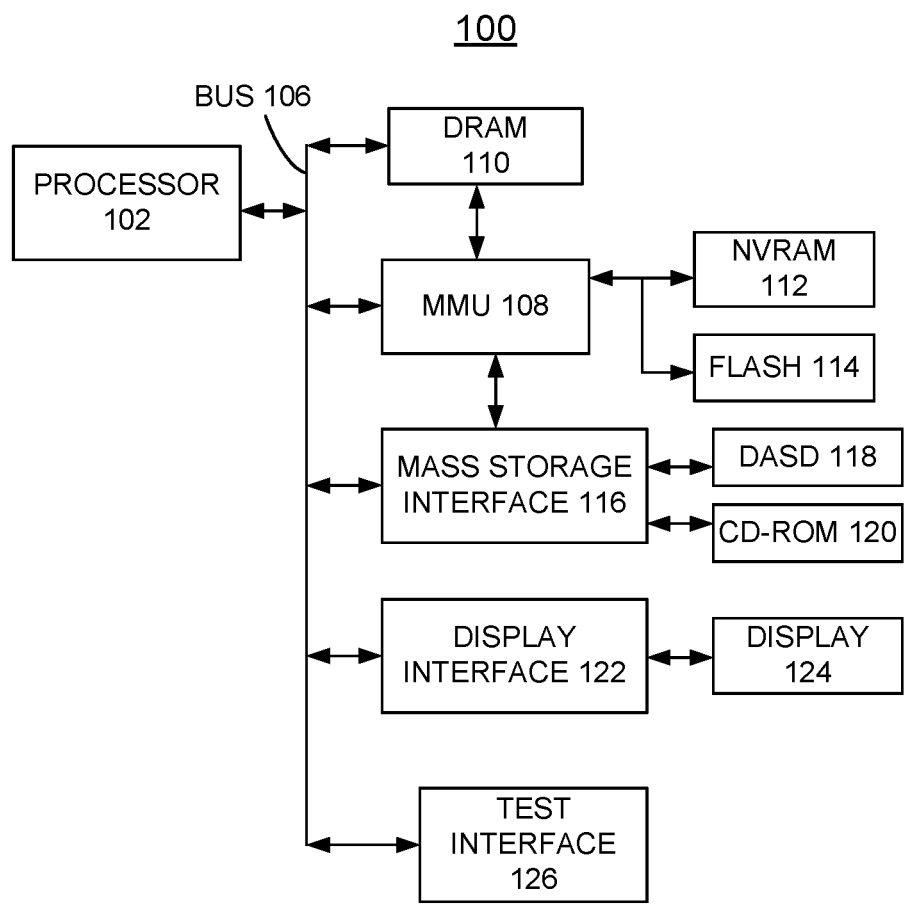
FIGS. 1 and 2 together provide a block diagram representation illustrating an example computer system and operating system for implementing frequency spectrum analysis of noise in a device or hardware under test using causality (Hilbert Transform) results of Vector Network Analyzer (VNA) VNA-generated S-parameter model information in accordance with the preferred embodiment.
Figure 2:
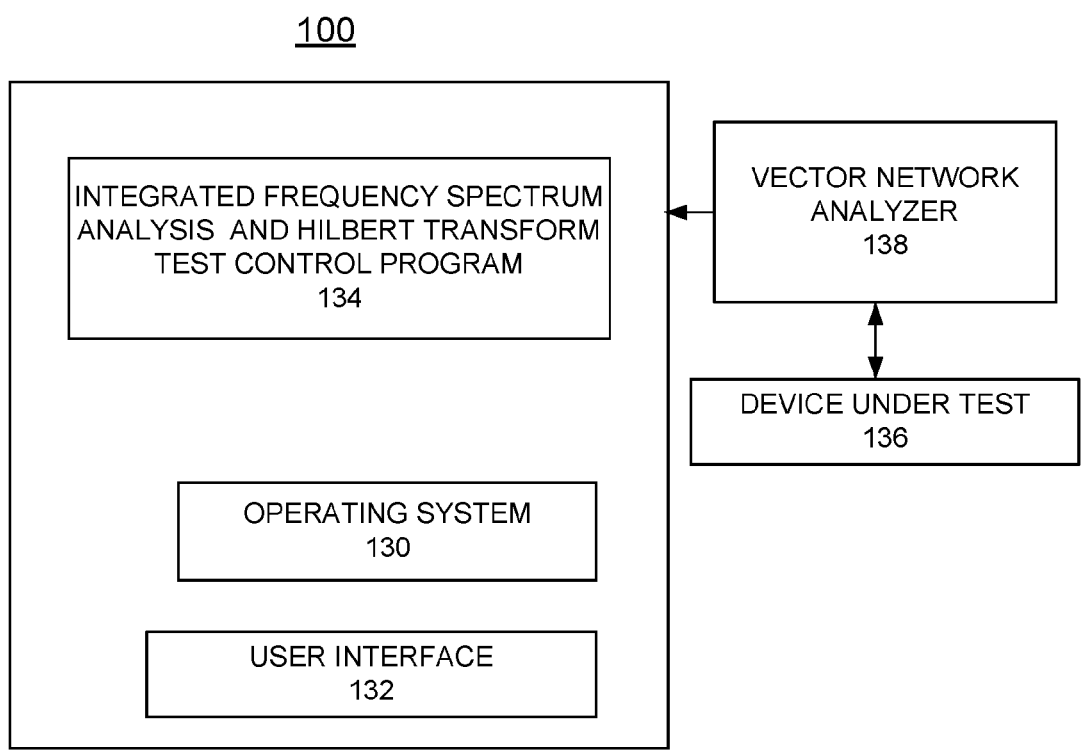

Having reference now to the drawings, in FIGS. 1 and 2, there is shown an example computer system generally designated by the reference character 100 for implementing frequency spectrum analysis of noise at a device or hardware under test using causality (Hilbert Transform) results of Vector Network Analyzer (VNA) VNA-generated S-parameter model information in accordance with the preferred embodiment.

Computer system 100 includes one or more processors 102 coupled by a system bus 106 to a memory management unit (MMU) 108 and system memory including a dynamic random access memory (DRAM) 110, a nonvolatile random access memory (NVRAM) 112, and a flash memory 114. The system bus 106 may be private or public, and it should be understood that the present invention is not limited to a particular bus topology used. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106.

In FIG. 2, computer system 100 includes an operating system 130, a user interface 132 and an integrated frequency spectrum analysis and Hilbert Transform test control program 134 in accordance with the preferred embodiments. A device under test 136 is coupled to a Vector Network Analyzer (VNA) 138 and the S-parameter samples from the VNA are processed using a Hilbert Transform method by the integrated frequency spectrum analysis and Hilbert Transform test control program 134 in accordance with the preferred embodiment. Vector Network Analyzer (VNA) 138 can be implemented, for example, with an Agilent ENA product manufactured and sold by Agilent Technologies of Santa Clara, Calif., USA.

Computer system 100 is shown in simplified form sufficient for understanding the present invention. The illustrated computer system 100 is not intended to imply architectural or functional limitations. It should be understood that the present invention can be used with various hardware implementations and systems and various other internal hardware devices. For example, an integrated computer/operating system within the Vector Network Analyzer 138 could perform the integrated frequency spectrum analysis and Hilbert Transform test control program 134 and function of external computer system 100 in accordance with the invention.

Figure 3:
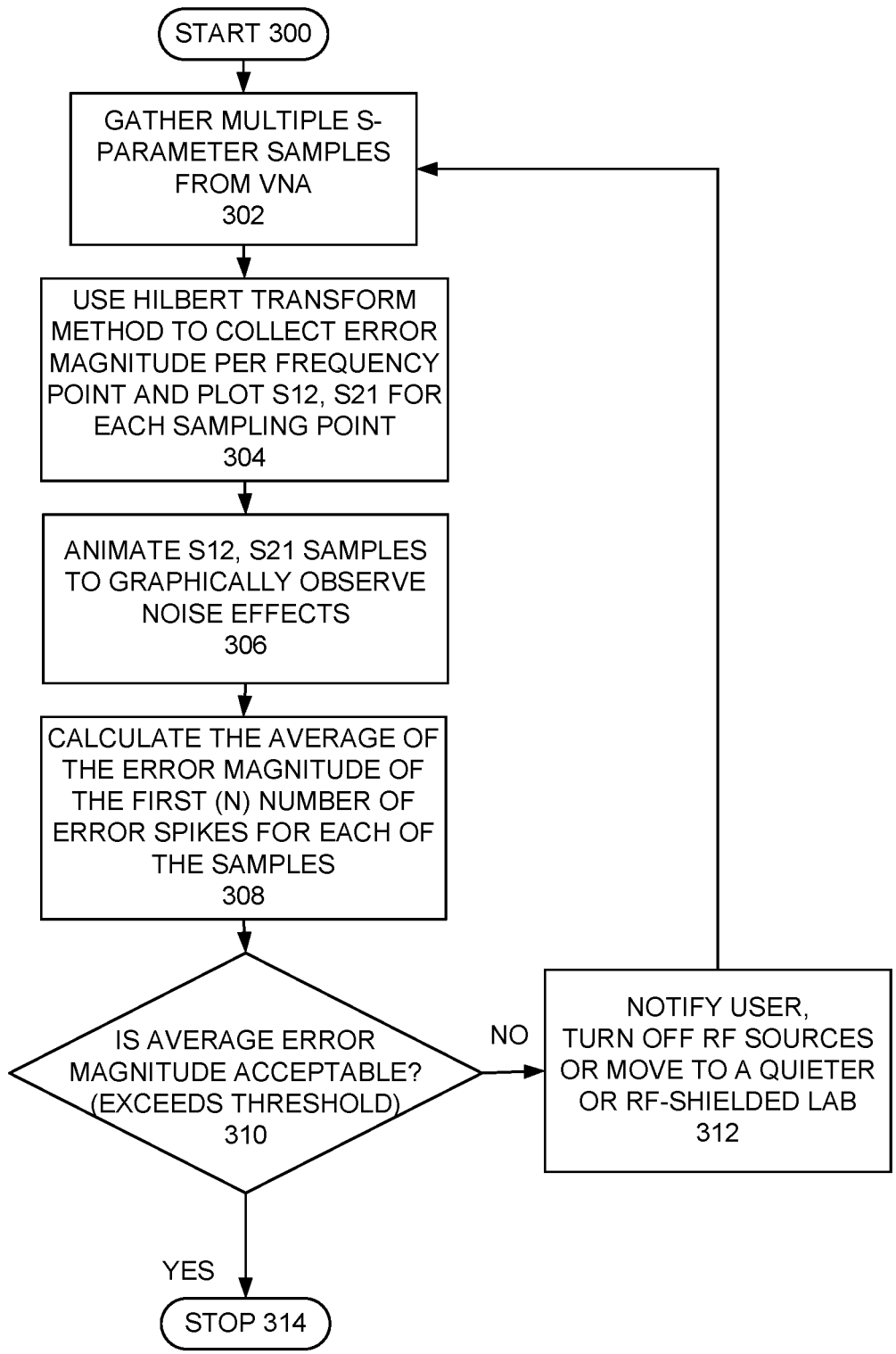
FIG. 3 is a flow chart illustrating exemplary operations for implementing frequency spectrum analysis of noise in a device or hardware under test using causality (Hilbert Transform) results of Vector Network Analyzer (VNA) VNA-generated S-parameter model Information in accordance with the preferred embodiments.

Computer system 100 implements enhanced frequency spectrum analysis using the Hilbert Transform in accordance with the invention, for example as illustrated and described with respect to FIG. 3.

Referring to FIG. 3, there is shown a flow chart illustrating example operations performed by the computer system 100 for implementing frequency spectrum analysis using the Hilbert Transform in accordance with the preferred embodiments. Operations start as indicated in a block 300. Multiple scattering-parameter (S-parameter) samples are collected from VNA generated S-parameter model information from the Vector Network Analyzer (VNA) 138 as indicated in a block 302.

In accordance with features of the invention, an engineer can determine the amount of environmental noise that the measured device receives and take steps to remove noise sources or seek shielded laboratory space.

In accordance with features of the invention, environmental noise, for example, from RF sources such as WIFI, BLUETOOTH®, registered trademark of BLUETOOTH SIG, INC. of Kirkland Wash., cell-phones, lab instrumentation, and the like, at the point-of-measurement affect the VNA-generated s-parameter model and can be seen in the error-magnitude per frequency point analysis. Multiple measurements or samples capture instantaneous noise events that occur in a given laboratory environment and advantageously are subsequently combined to form a picture of the amount of noise present and act like a frequency spectrum analyzer or EMI receiver.

A Hilbert Transform method is used to collect error magnitude per frequency point of the plurality of S-parameter samples for error magnitude frequency point analysis as indicated in a block 304. The Hilbert Transform is a linear operator which takes a function, u(t) and produces a function H(u)(t). For example, Hilbert Transform results are used to collect error magnitude per frequency point and S-parameter samples, such as scattering insertion samples or S12 and S21 samples, are graphically represented or plot for each sampling point at block 304.

The S12, S21 samples are animated enabling noise effects to be graphically observed as indicated in a block 306. An average error magnitude of predefined collected error magnitude samples is calculated to identify environmental noise in the device under test as indicated in a block 308. For example, the first (N) number of error spikes for each of the samples is used to calculate the average error magnitude at block 308.

As indicated in a decision block 310, checking is performed to determine whether the average error magnitude is acceptable. For example, the average error magnitude of the first (N) number of error spikes for each of the samples is compared with a predefined noise threshold to determine whether the average error magnitude is acceptable. If the average error magnitude is not acceptable, then a user is notified and RF sources are turned off or moving to a quieter or an RF-shielded lab is provided as indicated in a block 312 and the steps are repeated returning to block 302 and samples from the VNA 138 collected with the RF sources disabled or at the new lab. Otherwise if the average error magnitude is acceptable, then the operations end as indicated in a block 314.

Figure 4:
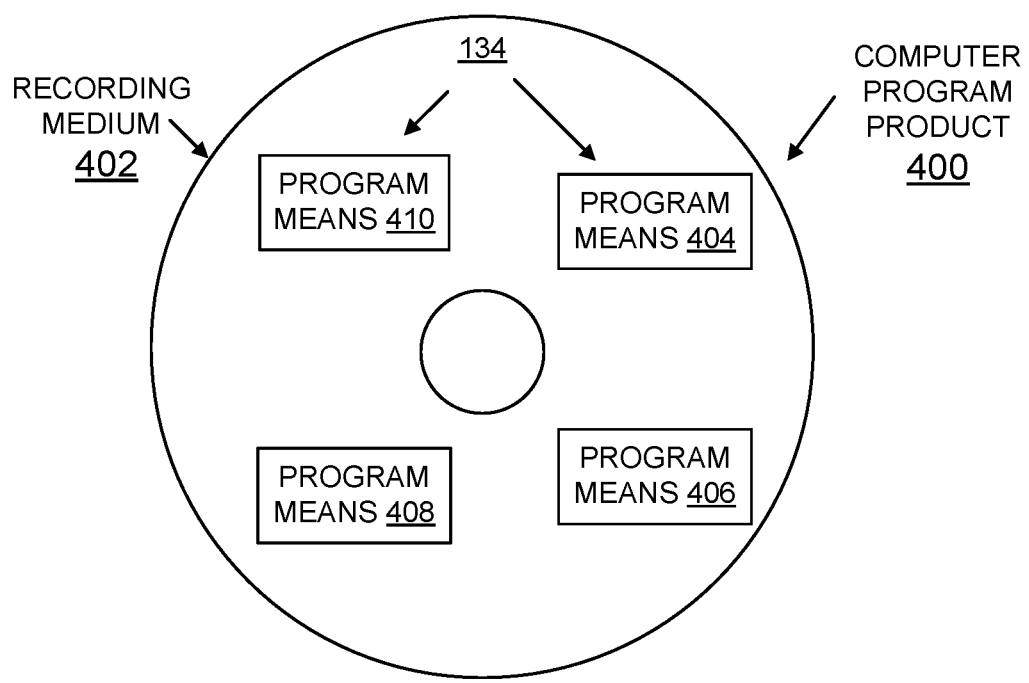
FIG. 4 is a block diagram illustrating a computer program product in accordance with the preferred embodiment.

Referring now to FIG. 4, an article of manufacture or a computer program product 400 of the invention is illustrated. The computer program product 400 is tangibly embodied on a non-transitory computer readable storage medium that includes a recording medium 402, such as, a floppy disk, a high capacity read only memory in the form of an optically read compact disk or CD-ROM, a tape, or another similar computer program product. Recording medium 402 stores program means 404, 406, 408, and 410 on the medium 402 for carrying out the methods for implementing frequency spectrum analysis using the Hilbert Transform of the preferred embodiment in the system 100 of FIGS. 1 and 2.

A sequence of program instructions or a logical assembly of one or more interrelated modules defined by the recorded program means 404, 406, 408, and 410, defining the integrated frequency spectrum analysis and Hilbert Transform test control program 134, direct the computer system 100 for implementing frequency spectrum analysis using the Hilbert Transform of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing frequency spectrum analysis of noise in a device under test comprising:
    collecting a plurality of scattering-parameter (S-parameter) samples from VNA generated S-parameter model information;
    generating a Hilbert Transform of the plurality of S-parameter samples to collect error magnitude for frequency point analysis;
    calculating an average error magnitude of predefined collected error magnitude samples using the collected error magnitude for frequency point analysis to identify environmental noise in the device under test; and
    using said calculated average error magnitude of said predefined collected error magnitude samples to identify acceptable environmental effects on the device under test; and notifying a user responsive to an identified unacceptable average error magnitude.

2. The method as recited in claim 1 wherein responsive to said calculated average error magnitude of said predefined collected error magnitude samples, a user determines to remove noise sources.

3. The computer-implemented method as recited in claim 1 wherein responsive to said calculated average error magnitude of said predefined collected error magnitude samples, a user determines to move to a different shielded laboratory space.

4. The computer-implemented method as recited in claim 1 includes performing a predefined noise threshold compare to identify acceptable environmental effects on the device under test.

5. The computer-implemented method as recited in claim 1 wherein providing a Hilbert Transform of the plurality of S-parameter samples to collect error magnitude for frequency point analysis includes comparing the original plurality of S-parameter samples with reconstructed model data using the Hilbert Transform and wherein multiple samples capture instantaneous noise events occurring in a laboratory environment for the device under test.

6. The computer-implemented method as recited in claim 5 includes combining the multiple samples to provide a frequency spectrum analyzer function.

7. The computer-implemented method as recited in claim 1 includes providing causality checking with the Hilbert Transform of the plurality of S-parameter samples.

8. The computer-implemented method as recited in claim 7 includes using the causality checking results for displaying a graphical representation of environmental noise in the device under test.

9. The method as recited in claim 7 includes using a processor for animating error magnitude samples and said processor using the animated error magnitude samples to graphically display noise effects.

10. A system for implementing frequency spectrum analysis for a device under test using a Hilbert Transform comprising:
    a processor,
    an integrated frequency spectrum analysis and Hilbert Transform test control program tangibly embodied in a non-transitory machine readable medium;
    said processor using said integrated frequency spectrum analysis and Hilbert Transform test control program for implementing frequency spectrum analysis of noise at the device under test;
    said processor collecting a plurality of scattering-parameter (S-parameter) samples from VNA generated S-parameter model information;
    said processor generating a Hilbert Transform of the plurality of S-parameter samples to collect error magnitude for frequency point analysis;
    said processor calculating an average error magnitude of predefined collected error magnitude samples using the collected error magnitude for frequency point analysis to identify environmental noise in the device under test; and
    said processor using said calculated average error magnitude of said predefined collected error magnitude samples to identify acceptable environmental effects on the device under test; and notifying a user responsive to an identified unacceptable average error magnitude.

11. The system as recited in claim 10 includes said processor responsive to said calculated average error magnitude of said predefined collected error magnitude samples, performing a predefined noise threshold compare to identify acceptable environmental effects on the device under test.

12. The system as recited in claim 10 wherein said processor providing a Hilbert Transform of the plurality of S-parameter samples to collect error magnitude for frequency point analysis includes said processor comparing the original plurality of S-parameter samples with reconstructed model data using the Hilbert Transform and wherein multiple samples capture instantaneous noise events occurring in a laboratory environment for the device under test.

13. The system as recited in claim 12 includes said processor combining the multiple samples to provide a frequency spectrum analyzer function.

14. The system as recited in claim 10 includes said processor providing causality checking with the Hilbert Transform of the plurality of S-parameter samples.

15. The system as recited in claim 14 includes said processor using the causality checking results for displaying a graphical representation of environmental noise in the device under test.

16. The system as recited in claim 14 includes said processor animating error magnitude samples, said processor using the animated error magnitude samples to graphically display noise effects.

* * * * *